(12) United States Patent
Subramanian et al.

(10) Patent No.: US 8,773,185 B2
(45) Date of Patent: Jul. 8, 2014

(54) CALIBRATION OF DELAY CHAINS

(71) Applicant: ARM Limited, Cambridge (GB)

(72) Inventors: Sivaramakrishnan Subramanian, Bangalore (IN); Nidhir Kumar, Bangalore (IN); Sridhar Cheruku, Bangalore (IN)

(73) Assignee: ARM Limited, Cambridge (GB)

( * ) Notice: Subject to any disclaimer, the term of this patent is extended or adjusted under 35 U.S.C. 154(b) by 19 days.

(21) Appl. No.: 13/681,606

(22) Filed: Nov. 20, 2012

(65) Prior Publication Data
US 2014/0139277 A1  May 22, 2014

(51) Int. Cl.
  *H03L 7/06* (2006.01)
(52) U.S. Cl.
  USPC ............ 327/158; 327/156; 375/376; 375/373
(58) Field of Classification Search
  USPC .................................. 327/158, 156; 375/373
  See application file for complete search history.

(56) References Cited

U.S. PATENT DOCUMENTS

| | | | | |
|---|---|---|---|---|
| 5,488,641 | A * | 1/1996 | Ozkan .......................... | 375/374 |
| 8,237,475 | B1 | 8/2012 | Nagarajan et al. | |
| 2004/0101079 | A1* | 5/2004 | Braceras et al. .............. | 375/373 |
| 2004/0247066 | A1* | 12/2004 | Suda .............................. | 375/376 |
| 2006/0022737 | A1 | 2/2006 | Gregorius et al. | |
| 2009/0267668 | A1 | 10/2009 | Lin | |
| 2013/0141149 | A1 | 6/2013 | Hsueh et al. | |

OTHER PUBLICATIONS

S. Hoyos et al, "A 15 MHz to 600 MHz, 20 mW, 0.38 $mm^2$ Split-Control, Fast Coarse Locking Digital DLL in 0.13 µm CMOS" *IEEE Transactions on Very Large Scale Integration (VLSI) Systems*, 2011, pp. 1-5.
J.J. Kim et al, "A Low-Jitter Mixed-Mode DLL for High-Speed DRAM Applications" *IEEE Journal of Solid-State Circuits*, vol. 35, No. 10, Oct. 2000, pp. 1430-1436.
J.G. Maneatis, "Low-Jitter Process-Independent DLL and PLL Based on Self-Biased Techniques" *IEEE Journal of Solid-State Circuits*, vol. 31, No. 11, Nov. 1996, pp. 1723-1732.
K.-I. Oh et al, "Low-jitter multi-phase digital DLL with closest edge selection scheme for DRR memory interface" *Electronics Letters*, vol. 44, No. 19, Sep. 2008, 2 pages.
GB Search Report mailed Apr. 3, 2014 in GB 1320392.2.

* cited by examiner

*Primary Examiner* — Ryan Jager
(74) *Attorney, Agent, or Firm* — Nixon & Vanderhye P.C.

(57) ABSTRACT

A calibratable delay chain having a delay chain and an adjustment circuitry varying a delay of each of the plurality of delay stages in the chain. The calibration circuitry is configured to calibrate a delay of the delay chain. The calibration circuitry includes calibration control circuitry for controlling the calibration and supplying the input value to an adjustment circuitry. Output selection circuitry is provided to select an output from a predetermined point along the delay chain. A bypass path bypasses the delay chain and a digital comparator compares an output from the delay chain and an output from the bypass path. An analogue comparator compares an output from the delay chain and an output from the bypass path. The calibration control circuitry is configured to control the output selection circuitry to output a signal from one point on the delay chain to the digital comparator.

20 Claims, 11 Drawing Sheets

CALIBRATION OF DELAY CHAINS

TECHNICAL FIELD

The technical field relates to data processing apparatus and in particular, to the calibration of delay paths for delaying a clock signal in order to shift the clock signal by a predetermined phase.

BACKGROUND

In many data processing systems it may be desirable to phase align two signals, or to have a predetermined phase difference between them. For example, in DDR PHY (double date rate physical layer) there is a requirement to shift the clock input by both 360° and by 90° for effective data capture.

In these systems the phase difference is provided by delaying a clock signal by a predetermined amount using a delay locked loop DLL. The delay in the DLL is provided by multiple basic delay stages arranged in a chain, the delay across the whole chain being set to one clock cycle. The delay chain may be designed from CMOS or CML (current-mode logic) styles of inverters, CML stages generally being preferred over CMOS as they show better power supply noise immunity. As the delay of these CML stages vary with PVT (process, Voltage and temperature) calibration is needed to keep the delay constant or nearly constant across these different PVTs. Adjustment devices such as binary weighted capacitive or resistive load inside the CML stages may be used to adjust the delay.

In devices of the prior art the phase difference between the clock signal passing through the chain and the clock signal passing through a bypass line has been compared during calibration using an analogue comparator. An analogue comparator according to the prior art it shown in FIG. 1a along with a timing diagram FIG. 1b showing the signals.

In the analogue comparator of FIG. 1a there are two inputs that receive signals one output1, that being the output of the delay chain and the other, output2 being an output from the bypass path. These signals are passed into an exclusive OR gate 12 which generates a signal Y indicative of whether these values are the same or are different and a signal YB which is the inverted value of Y.

These signals Y, YB are then input to averaging circuit 14 which forms an average of these values. A comparison is then done using comparator 16. The averaging circuit 14 is present to prevent or at least impede false results due to jitter. An analogue comparator is an accurate way of comparing the signals but it takes time to perform each comparison due to the averaging and the desire to allow the signals to settle.

Looking at FIG. 1b we see that where the signals are nearly aligned the output Y is positive for very little of the time whereas the output YB is positive for a lot of the time. Thus, the average of YB is far greater than the average value of Y. As the signals get out of phase this difference reduces until at a 90° phase difference the signals cross over and the average value of Y starts to become greater than the average value of YB. This analogue comparator therefore provides a very good way of detecting a quarter phase change, that is a phase change of either 90° or 270°. It cannot be used to detect any other phase change.

Thus, in a device of the prior art where a 360° phase change is required an output signal will be taken from a quarter of the length of the delay chain and the analogue comparator is used to determine when the signal is 90° out of phase. It is then assumed that the whole delay chain has a delay of 4 times this, that is 360°. This is acceptable provided the delay stages are well matched.

In order for the analogue comparator 10 to be able to produce an accurate result a time of about of 500 nanoseconds per reading is required. This is a significant time and makes the calibration a lengthy process. For this reason, in devices of the prior art the adjustments to the delay stages are initially made in large steps and a rough estimate found, whereupon the calibration is performed again around this point in smaller steps.

It would be desirable to be able to make an accurate calibration in less time.

SUMMARY

A first aspect of the present invention provides a calibratable delay chain comprising:

a delay chain comprising a plurality of delay stages and adjustment circuitry configured to vary a delay of each of said plurality of delay stages in response to an input value; and calibration circuitry configured to calibrate a delay of said delay chain, wherein said calibration circuitry comprises:

calibration control circuitry for controlling said calibration and supplying said input value to said adjustment circuitry;

output selection circuitry configured to select an output from a predetermined point along said delay chain;

a bypass path for bypassing said delay chain;

a digital comparator configured to compare an output from said delay chain and an output from said bypass path;

an analogue comparator configured to compare an output from said delay chain and an output from said bypass path; wherein said calibration control circuitry is configured to control said output selection circuitry to output a signal from one point on said delay chain to said digital comparator and to change said input value to said adjustment circuitry in a first direction at a first rate until a change in an output value of said digital comparator value is detected;

said calibration control circuitry is configured to respond to said detected change in output value of said digital comparator to control said output selection circuitry to output a signal from a further point on said delay chain to said analogue comparator and to change said input value in a second direction at a second rate starting from a value determined by said input value at which said digital comparator's output value changed value, said second rate being slower than said first rate, a change in value output from said analogue comparator indicating an input value that provides a calibrated delay.

The technology described herein recognises that although analogue comparators provided an accurate way of finding a quarter phase delay, the time required for each comparison to be made is high resulting in a lengthy calibration. The technology also recognises that digital comparators respond quickly to differences in input signal levels and as such can perform comparisons much more quickly than analogue comparators, albeit with less accuracy. A much quicker calibration could therefore be performed if a digital comparator were used. Furthermore, no accuracy needs to be lost if the digital comparator is used to provide a rough estimate of the required delay, and an analogue comparator used to compare the output signals at this point or at a point near this point to find an accurate calibrated value.

In this way a far quicker calibration than an analogue only calibration can be performed without any loss of accuracy.

Although the analogue comparator may have a number of forms, in some embodiments said analogue comparator comprises circuitry for providing a signal indicating when said two output signals have a same value and a signal indicating when said two output signals have different values and averaging circuitry configured to average said two signals over time, said analogue comparator comparing said two averaged signals and detecting a point at which a larger of said two averaged signals becomes a smaller of said two averaged signal, such that said analogue comparator circuitry is configured to detect a quarter phase difference between said output signals.

Analogue comparators work well where they compare average signals as any jitter on the signal can be averaged out. However, if this is the case then they generally can only compare signals that are a quarter phase out of synchronisation with each other. This means that if a delay of a full phase is required then calibrating it with the analogue circuitry can only calibrate the 90° or a 270° point and one must assume that the chain is uniform. Generally the delay chains are designed to be uniform but there will be some non-uniformities.

In some embodiments, said analogue comparator comprises:

exclusive OR circuitry for exclusive ORing the two outputs together and an inverter for generating an inverted value of said exclusive OR output;

averaging circuitry for generating an averaged value of said exclusive OR output and an averaged value of said inverted value of said exclusive OR output; and a comparator for comparing said two averaged values and indicating when one of said two averaged values that was smaller than another becomes larger.

In some embodiments said digital comparator is configured to determine when an output of said delay chain has a different value to an output of said bypass path, such that a change in output value of said digital comparator indicates a phase difference of 360° or a whole clock cycle between said two outputs.

Digital comparators can be used to detect differences in signal levels. They may therefore be used to detect phase difference of 360° which is often the difference that is required in delay locked loops for example.

In some embodiments, said output selection circuitry is configured to output a signal from an end of said delay chain to said digital comparator and from a point three quarters of the way along said delay chain to said analogue comparator, said digital comparator changing value in response to said output signal being delayed by a whole clock cycle, and said analogue comparator changing value in response to said output signal being delayed by three quarters of a clock cycle, such that said calibrated delay for said delay chain is a whole clock cycle delay.

As noted above digital comparators are well adapted to detect signals being delayed by 360° or a whole clock cycle, while analogue comparators are well adapted to detect signals delayed of a quarter of a clock cycle out of phase. Therefore, it is advantageous if the analogue comparator compares a signal from three quarters of the way along the delay chain and the digital comparator from the end of the delay chain, such that they both detect approximately the same phase difference. Taking the signal from three quarters of the way along the chain, rather than from a quarter of the way along, means that more of the delay chain is used in the measurement such that the effect of any non-uniformities in the chain on the result is reduced.

In some embodiments, said digital comparator is a flip flop and in some cases a D flip flop and the calibration control circuitry is configured to detect said output of said D flip flop changing from a one to zero indicating that said two signals are moving into alignment.

The digital comparator may have a number of forms, it may be a flip flop and in some cases a D-flip fop. A flip flop will change value when the input signals change value which will provide a good indication signal for the calibration control circuitry. Where the calibration control circuitry is looking for a 360° phase change then it will detect when the output of a D flip flop changes from a 1 to a 0 which will indicate that the two signals are moving into alignment.

In some embodiments, the first and second directions may be different directions while in other embodiments the first and second directions may be the same direction.

When determining whether to continue to change the value in the same direction during the analogue comparison as during the digital comparison, one needs to know whether the digital comparison was an over or under estimate as this will indicate where the real alignment point is. If one does not know this, then rather than using the detected value the detected value that has been changed to ensure that it is either an underestimate or an overestimate can be used. In effect if the digital comparison is thought to have occurred too early then the second direction should be the same as the first, while if it is thought to have occurred too late, then the second direction should be in the opposite direction In some embodiments, said calibration control circuitry is configured to perform a verification step prior to controlling said output selection circuitry to output a value to said analogue comparator, said verification step being for verifying that said change in output value of said digital comparator is due to a difference in output signals and not to jitter on one of said output signals, said verification step comprising:

varying said input value further in said first direction by a predetermined amount and determining whether said digital comparator continues to output said changed output value, if said digital comparator continues to output said changed output value said calibration control circuitry determines that said detected change in output values is due to a difference in output signals and proceeds to control said output selection circuitry to output a value to said analogue comparator.

It may be advantageous if the calibration control circuitry verifies the rough estimate provided by the digital comparator. The digital comparator compares two signals and indicates when one of them changes with respect to the other. It may be that jitter on one of the signals triggers the digital comparators to change and generates a false positive. In order to avoid analogue comparisons being made from a point that is not close to the required phase delay, it may be advantageous if a verification step is performed following detection of a change in signals by the digital comparator. In the verification step the input value can be incremented by a predetermined amount and if the output of the digital comparator does not change from the value output when the detection was made, then the rough estimate is judged to be correct and this input value can be used as the starting value for the analogue comparison. If however it changes then the rough estimate was a false positive and should be discarded.

In some embodiments, said calibration control circuitry is configured in response to said digital comparator not continuing to output said changed output value during said verification step to continue to increase said input value in said first direction until a further change in output value is detected and to perform said verification step for said further change in output value.

Where the verification step indicates a false positive then the digital comparator continues to check its two input signals while the input values and therefore the delay are changed, until a new positive is found whereupon the verification step is performed again.

In some embodiments, said predetermined amount that said input value is increased by in said verification step is selected to change a delay in said delay chain by a time amount that is longer than a predicted jitter pulse.

In order for the verification step to be able to reliably discount false positives dues to jitter, the predetermined amount that the input value is increased by should be longer than a jitter signal is predicted to last such that if the positive was due to jitter then when the new measurement is taken the jitter should no longer be present on the signal.

Although the output selection circuitry can comprise a number of things, in some embodiments it comprises a multiplexer. Similarly the adjustment circuitry used will depend on the type of delay stage but in some embodiments the delays stages are made of CML current-mode logic and the adjustment circuitry comprises binary weighted capacitive or resistive load circuitry.

In some embodiments, the calibratable delay chain comprises 4n delay stages where n is an integer, and wherein said digital comparator compares an output from said delay chain after 4n delay stages, that is at an end of said delay chain and said analogue comparator compares an output from said delay chain after 3n delay stages.

Where the analogue comparator looks for signals that are quarter of a cycle out of phase while the digital comparator looks signals that are a whole cycle out of phase then it is desirable if a signal can be taken from three quarters of the length of the delay chain for the analogue comparison. In such a case, it is advantageous if the number of delay stages in the delay chain is divisible by four. Although a signal a quarter of a cycle out of phase could be taken after just n stages, taking the signal from after 3n stages means that more of the delay chain is used in the comparison and this reduces errors due to differences between different delay stages.

In some embodiments, said calibration control signal is configured to change said input value in steps and to hold said input value at each value for at least ten times longer during said analogue comparison than during said digital comparison.

The digital comparator can make its comparison far quicker than the analogue comparison and thus the calibration control circuitry needs to hold the input value steady for a much shorter time. In general the input value is held for at least $1/10^{th}$ of the time it is held for the analogue signal and in some embodiments for $1/50^{th}$.

A second aspect provides a delay locked loop comprising a delay chain according to a first aspect.

Although the delay chain can be used in a number of devices where a calibrated delay is required, it is particularly suitable for a delay locked loop, which are designed to generate clock signals with a certain phase difference to other clock signals.

A third aspect provides a method of calibrating a delay chain, said delay chain comprising a plurality of stages and adjustment circuitry configured to vary a delay of each of said plurality of delay stages in response to an input value; said method comprising the steps of:

outputting a signal from one point on said delay chain to a digital comparator;

outputting a signal from a bypass path not passing through said delay chain to said digital comparator;

varying an input value to said adjustment circuitry in a first direction at a first rate until a change in an output value of said digital comparator value is detected;

outputting a signal from a further point on said delay chain to an analogue comparator;

outputting a signal from a bypass path not passing through said delay chain to said analogue comparator;

varying said input value in a second direction at a second rate starting from a value determined by said value at which said digital comparator's output value changed value, said second rate being slower than said first rate until a change in value output from said analogue comparator is detected;

using said input values that generated said change in value output as calibration values for said delay chain.

A fourth aspect of the present invention provides calibratable delay chain comprising:

a delay chain comprising a plurality of delay means and adjustment means for varying a delay of each of said plurality of delay means in response to an input value; and calibration means for calibrating a delay of said delay chain, wherein said calibration means comprises:

calibration control means for controlling said calibration and supplying said input value to said adjustment circuitry;

output selection means for selecting an output from a predetermined point along said delay chain;

bypass means for bypassing said delay chain;

digital comparing means for comparing an output from said delay chain and an output of said bypass means;

analogue comparing means for comparing two output signals, an output signal from said delay chain and an output signal from said bypass means; wherein said calibration control means is for controlling said output selection means to output a signal from one point on said delay chain to said digital comparing means and for changing said input value to said adjustment means at a first rate until a change in an output value of said digital comparing means is detected;

said calibration control means is for responding to said detected output of said digital comparing means to control said output selection means to output a signal from a further point on said delay chain to said analogue comparing means and to change said input value at a second rate starting from a value determined by said input value at which said digital comparing means output value changed value, said second rate being slower than said first rate, a change in value output from said analogue comparing means indicating an input value that provides a calibrated delay.

The above, and other objects, features and advantages of this invention will be apparent from the following detailed description of illustrative embodiments which is to be read in connection with the accompanying drawings.

BRIEF DESCRIPTION OF THE DRAWINGS

FIG. 1b shows wave forms depicting the calibration formed by the analogue comparator comparison circuit of FIG. 1a;

DESCRIPTION OF THE EXAMPLE
NON-LIMITING EMBODIMENTS

Figure 2:
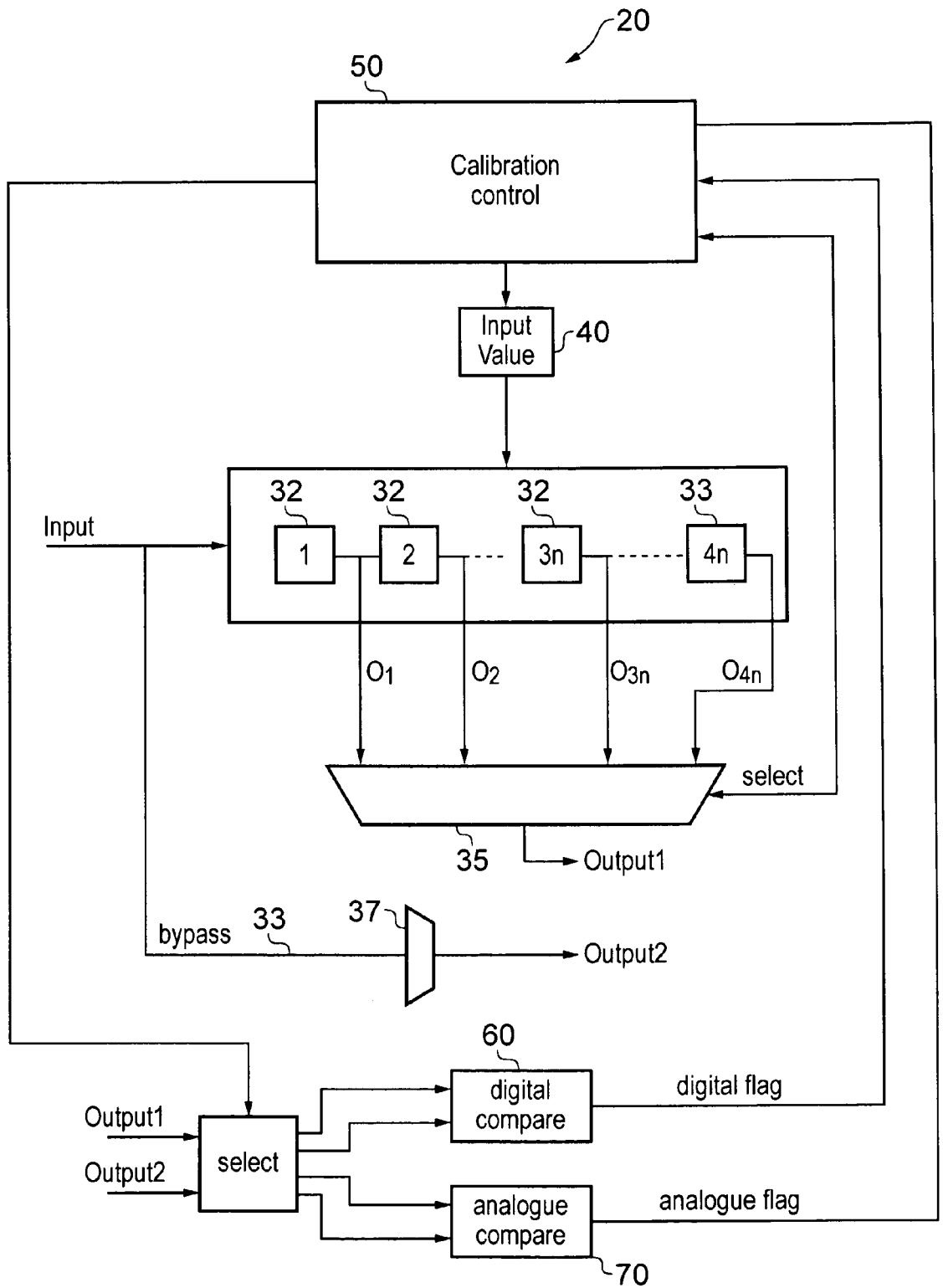
FIG. 2 shows a delay chain and calibration circuit 3 for calibrating that delay chain according to an embodiment of the present invention.

FIG. 2 shows a calibratable delay chain 20 according to an embodiment of the present invention. The calibratable delay chain comprises a delay chain 30 made up of individual stages 32. These stages have adjustable circuitry within them which changes the delay of the stage as a control value input to the stages changes. This may be in the form of variable resistive or capacitive loads such as binary weighted capacitive/resistive loads. The control value is an input value 40 generated by calibration control circuitry 50. The calibration control circuitry 50 increases or decreases the input value to increase or decrease the delay seen by the delay chain.

The calibratable delay chain also has a multiplexer 35 which can select an output from one of the stages in the delay chain, and forward this to selection circuitry 80 which transmits the outputs it receives to either an analogue comparator 70 or a digital comparator 60. The calibration control circuitry 50 controls the select signal for both the multiplexer 35 and the select circuitry 80.

In this embodiment, the digital comparator compares an output signal from the end of the delay chain $O_{4n}$ with the output signal Output2 which does not pass through the delay chain but is rather sent via a bypass path 33. Analogue comparator 70 compares the output from three quarters of the way along the delay chain output $O_{3n}$ with the output from the bypass path 33 output Output2. Bypass path 33 should mirror the path through the delay chain except for the delay chain part of that path, so that any difference in phase is due to the delay chain and can be controlled. For this reason there is a dummy multiplexer 37 on the bypass path that matches the multiplexer 35 and provides a similar delay to a clock signal passing through it.

As noted previously whether the two output signals from the bypass path and the delay chain are sent to the analogue or digital comparators is controlled by select circuitry 80 which is controlled by a signal from calibration control circuitry 50.

In operation, when the calibration control circuitry 50 calibrates the delay chain for a 360° phase shift, then initially it adjusts the input value 40 and selects the output $O_{4n}$ at the end of the delay chain 30 with multiplexer 35, sending this output signal via select circuitry 80 to the digital comparator 60. The digital comparator 60 will compare the output from the bypass path with the output from the end of the delay chain as the input value 40 is increased and the delay is increased. As a digital comparison is being made, the rate of change of the input value can be high of the order of 10 ns as the digital comparator 60 can make a comparison very quickly.

At a certain point the digital flag output from digital comparator 60 will indicate that the unaligned signals have become aligned again. The digital comparator 60 will trigger the digital flag to change value when either two rising edges or two falling edges occur at about the same time.

Figure 1A:
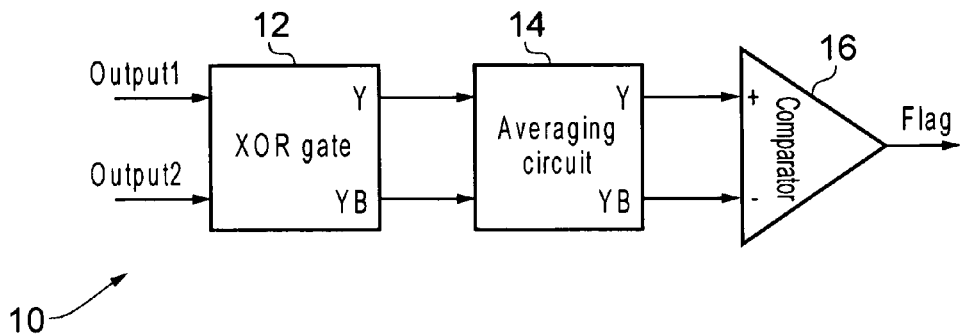
FIG. 1a shows an analogue comparison circuit according to an embodiment of the prior art.
Figure 1B:
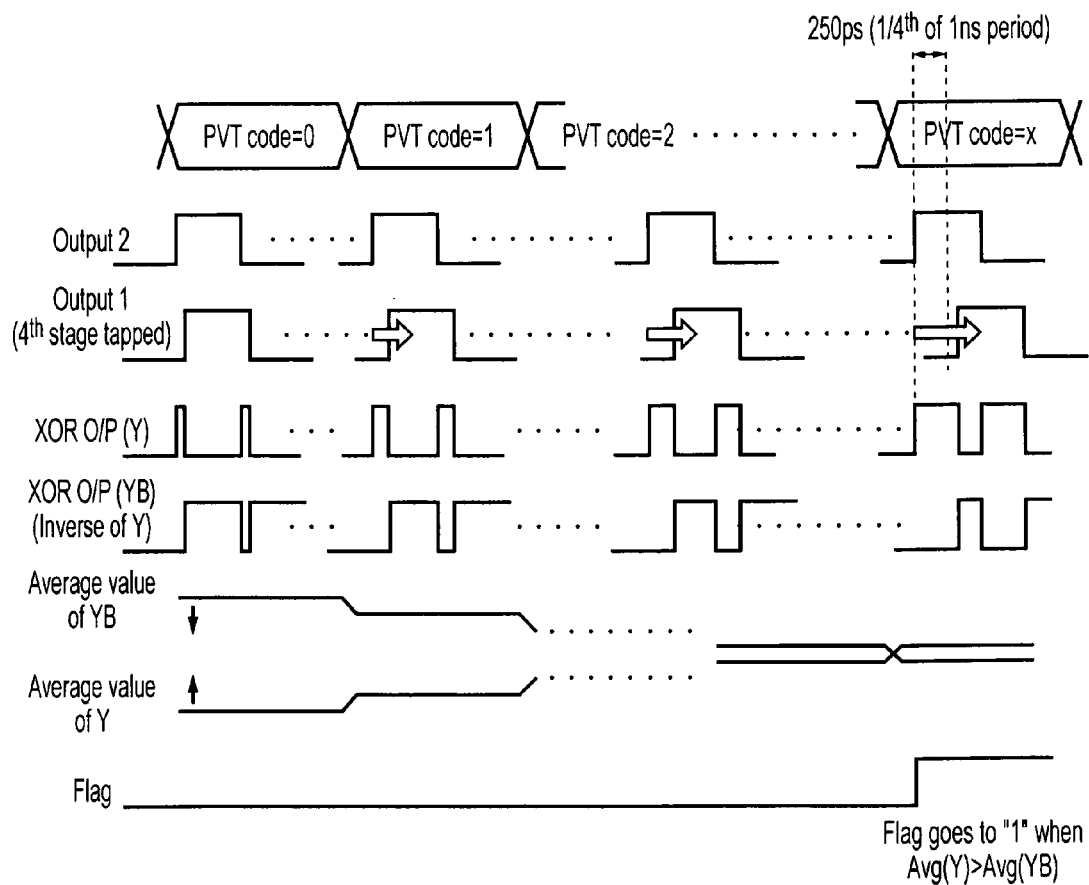

The calibration control circuitry 50 then knows that there is approximately a 360° phase shift in the two signals at this point. It will then transfer the select signal to multiplexer 35 to output an output signal from three quarters of the way along the delay chain that is $O_{3n}$ to output 1 and this will be output by a select circuitry 80 to analogue comparator 70 along with the output from the bypass path. The analogue comparator will compare the signals and find when there is a three quarter phase shift. It will start using the input value used when the digital comparator set the digital flag and will either continue increasing these values to increase the delay or will gradually decrease them until the cross over point shown in FIG. 1b is reached. At this point it will determine that the system is calibrated and will store the input value 40 used to generate this delay as the calibrated value. As the analogue comparator 70 takes much longer to make a comparison than the digital comparator 60 the input value will change at a much slower rate taking about 500 ns for each comparison.

It should be noted that by taking the value from three quarters of the way along the delay chain rather than a quarter of the way along as in the prior art any inhomogeneities in the first three quarters of the delay chain will be accounted for in the calibration and will not affect the results. This is clearly better than if only the first quarter are accounted for. In some embodiments, rather than stopping immediately once the digital flag is set the calibration control circuitry will control the input value to increase by a certain amount. This amount will be selected such that the delay increases beyond what is considered a reasonable length for a jitter signal. The output of the digital comparator is then checked again to check that the digital flag is still set and has not changed value. If it determines that it has not changed value then it is determined that the clock signals are aligned and the analogue comparison is made from the input value that caused the digital flag to be set.

If, however, increasing the input value by the certain amount provides a different digital flag output then it is determined that the digital flag did not indicate that the signals were approximately 360° out of phase but rather provided an indication of jitter on one of the signals. The calibration process then resumes with the input value being incremented at a particular rate until the digital flag signals alignment of the two signals again. At this point the jitter test can be performed again and when the jitter test confirms that the flag was not set due to jitter then the analogue comparison can be performed.

As noted above as each digital comparison can be performed very quickly the input value can be increased at a fast rate as the need to hold the signal steady for a long time between steps is not required for the digital comparison. When the analogue comparison is performed each increment of the input value signal needs to be held steady for some time while the analogue comparator settles in order for an accurate result to be achieved. Typical delay steps for the digital increments are of the order of 10 nanoseconds while for the analogue steps a delay of 500 nanoseconds is required.

Figure 3:
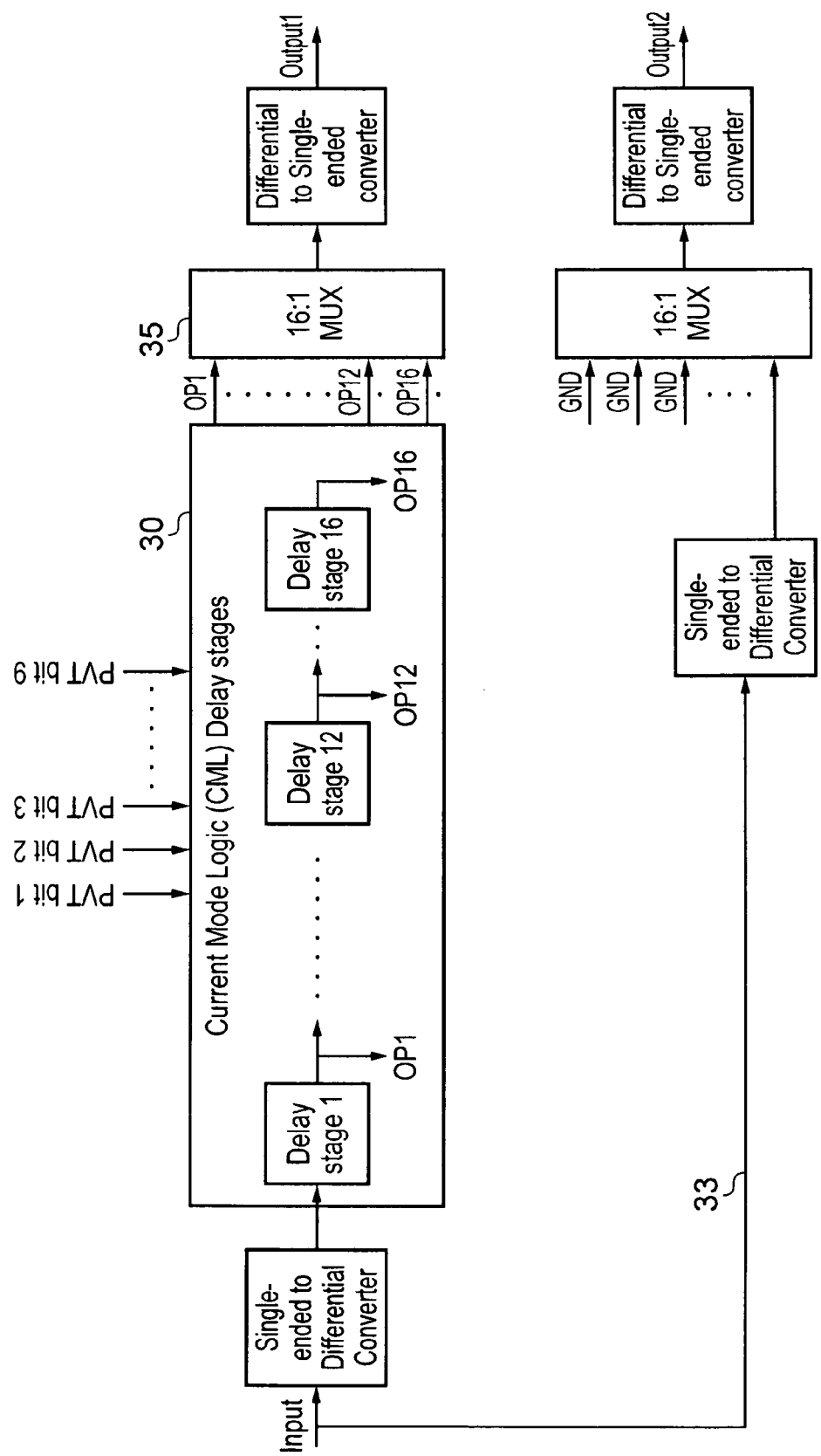
FIG. 3 shows an alternative embodiment of a delay chain and calibration circuitry according to an embodiment of the present invention.
Figure 3:
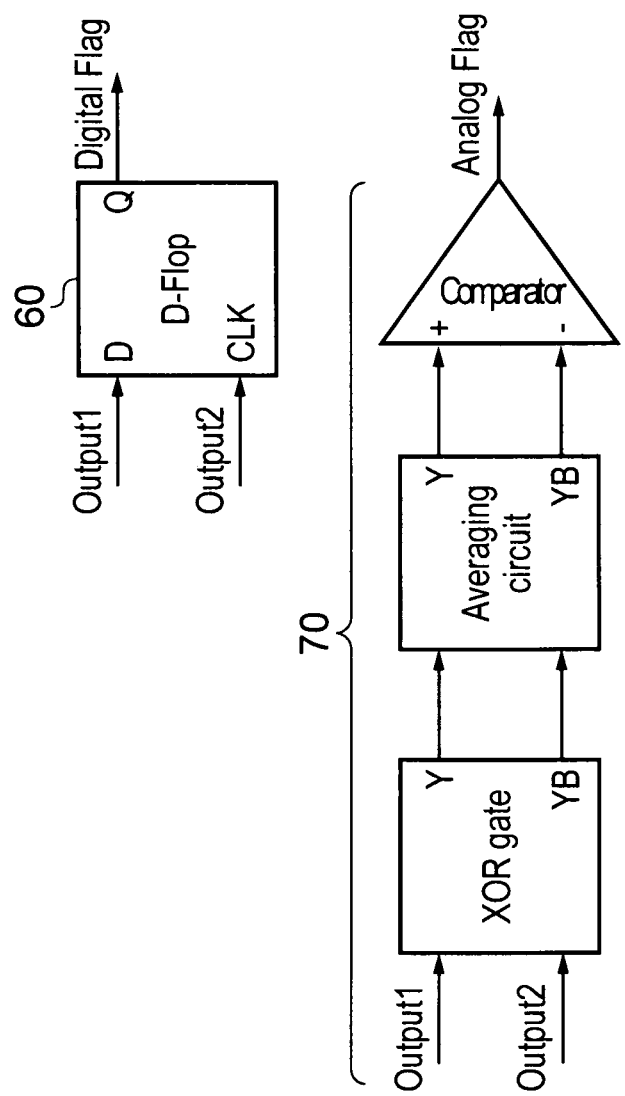

FIG. 3 schematically shows a master delay locked loop DLL having a delay chain according to an embodiment of the present invention. Delay chain 30 in this embodiment has 16 stages and therefore multiplexer 35 has 16 inputs that it selects between. Each delay stage is a 9-bit PVT controlled delay stage, a 9-bit input value being varied to adjust the delay of each stage. The 9-bit PVT values are used to give a 360° delay shift for an input frequency ranging from 400 MHz to 1067 MHz across PVT. A 16:1 multiplexer is used to select a signal from a different portion of the delay chain and therefore a signal having a different phase shift. The different stages should be closely matched for layout parasitics so that selecting a signal from say ¼ of the way along the delay chain should provide a phase delay of 90° if selecting the signal from the end provides a phase delay of 360°.

There is a single-ended to differential converter before the input and there is a differential to single-ended converter before the output in the delay path. The bypass path 33 therefore also has these devices and a dummy multiplexer on it such that any difference in delays between the paths are only due to the delay chain 30.

The digital comparator 60 in this embodiment is a D-flip flop while the analogue comparator 70 is similar to the analogue comparator of the prior art and comprises an XOR gate, averaging circuitry and a comparator. This diagram does not show the calibration control circuitry that controls the PVT signals and the select signals of the multiplexer, but this operates in the same way as for the circuit of FIG. 2 controlling the select signal of the multiplexers, which of the analogue or digital comparators they are sent to and the incrementing and decrementing of the PVT bits, which it does using a finite state machine.

Following calibration then the device operates as a delay locked loop DLL with the PVT bits set to the values determined during calibration to produce the required phase delay. This DLL is termed a master DLL as it has the calibration circuitry within it. The calibrated values for the PVT bits can be used in slave DLLs which are formed of the same components but have no calibration circuitry. In this way the calibrated result from one DLL can be used in other slave DLLs. As noted previously it is important that the delay stages are closely matched within a DLL and similarly if the calibrated values are to be calculated for one DLL and used in several, then it is important that they the different DLLs are formed of the same components in the same way.

Figure 4:
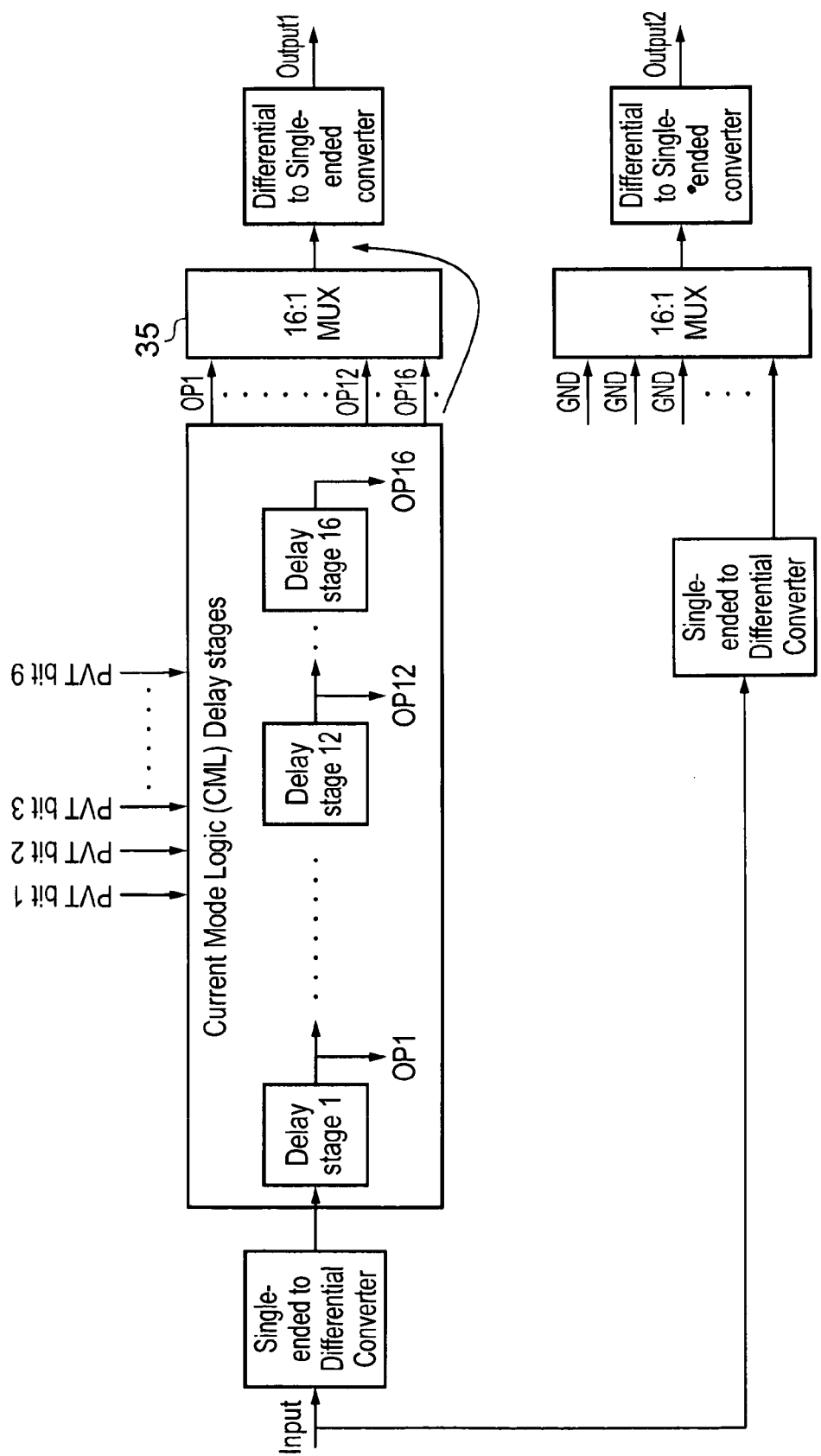
FIG. 4a shows the circuit of FIG. 3 during digital calibration.
Figure 4:
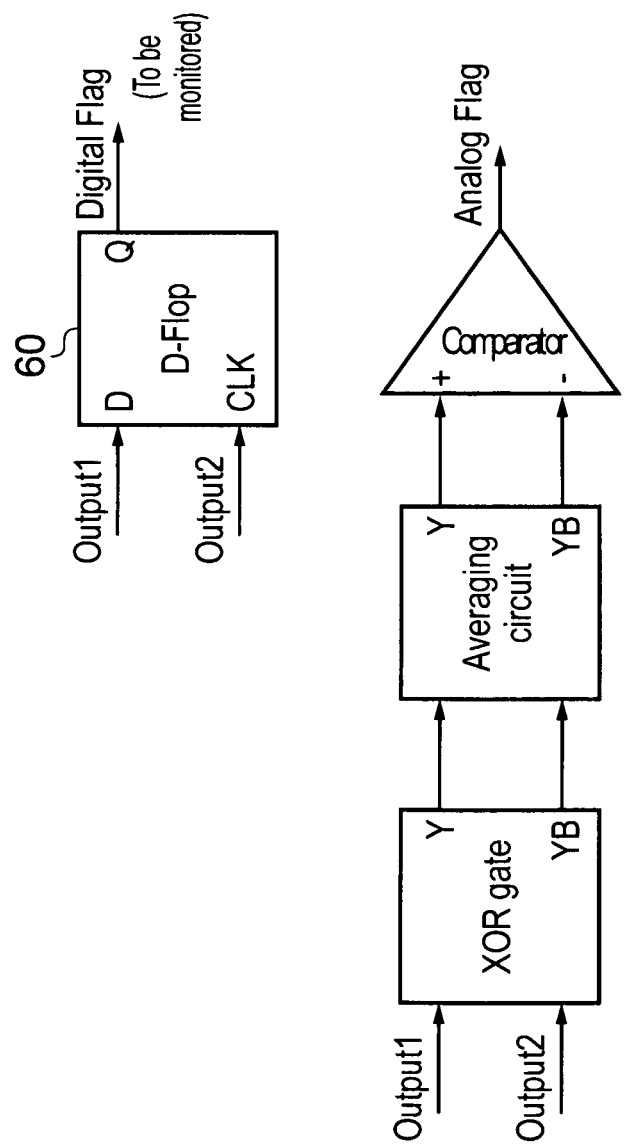
Figure 5:
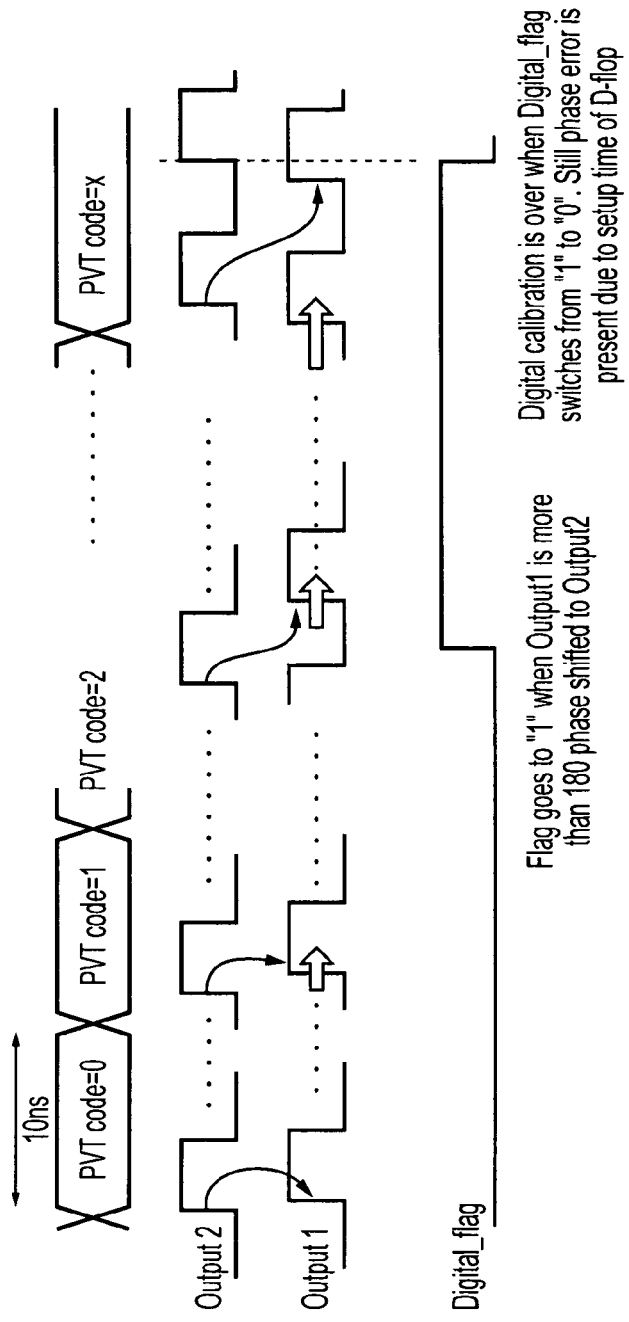
FIG. 5 shows the waveforms during the digital calibration.

FIG. 4 shows the circuitry of FIG. 3 during the digital comparison stage of the calibration. During this time the output from the 16$^{th}$ delay stage is selected by the multiplexer 35 and output to output 1. This is input to the digital comparator the D-flip-flop 60 and the digital flag is monitored. The PVT bits are incremented by a finite state machine under control of the calibration control circuitry (not shown) and the delay of the delay stages gradually increases. Thus, the rising edge of output1 is delayed and gets closer to the rising edge of output2. When it gets close to the rising edge of output 2, that is within the set up time of the D-flip-flop, the digital flag output by the flip-flop toggles from a 1 to a 0. As the digital comparator 60 can make comparisons very quickly the finite state machine can be incremented every 10 ns and as such incrementing in steps of 1 is acceptable. When the digital flag toggles this indicates that output1 and output2 have become at least roughly aligned that is the rising edges of the two devices are within a predetermined time of each other. The finite state machine stops incrementing the PVT code at this point and the delay chain is calibrated to an approximate delay of one period of the input clock FIG. 5 shows the clock signals of the circuit of FIG. 4 during the digital comparison. Initially they are almost aligned, the PVT codes are gradually increased and the clock signal of output1 is delayed, thus, the two signals move out of phase with each other and when they get to more than 180° out of phase the digital flag goes to 1. Digital calibration is complete when the digital flag goes from 1 to 0 indicating that the two signals are moving back into phase and at this point the rising edges are aligned.

Figure 6:
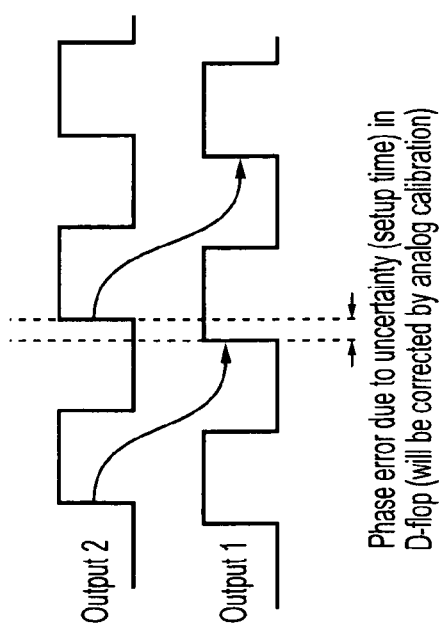
FIG. 6 shows in greater detail the phase error due to uncertainty in the set up time of the D-flop of the circuit of FIG. 4.

The result is not very accurate due to the setup time of the D-flop. FIG. 6 illustrates this issue, and shows how the D-flip-flop will have a phase error due to the uncertainty in the setup time for the flip flop. This error will be corrected by the analogue calibration which is performed later. Another source of error may be due to jitter on one of the signals. In order to avoid this producing a false result, rather than switching to analogue calibration immediately that the digital flag indicates alignment, in some embodiments, the input PVT values are increased by a set amount and a further reading is taken to check that the digital flag stays at the 0 value and does not switch back to 1. If it stays unchanged then the change was not due to jitter and one can proceed with the analogue calibration.

Figure 7:
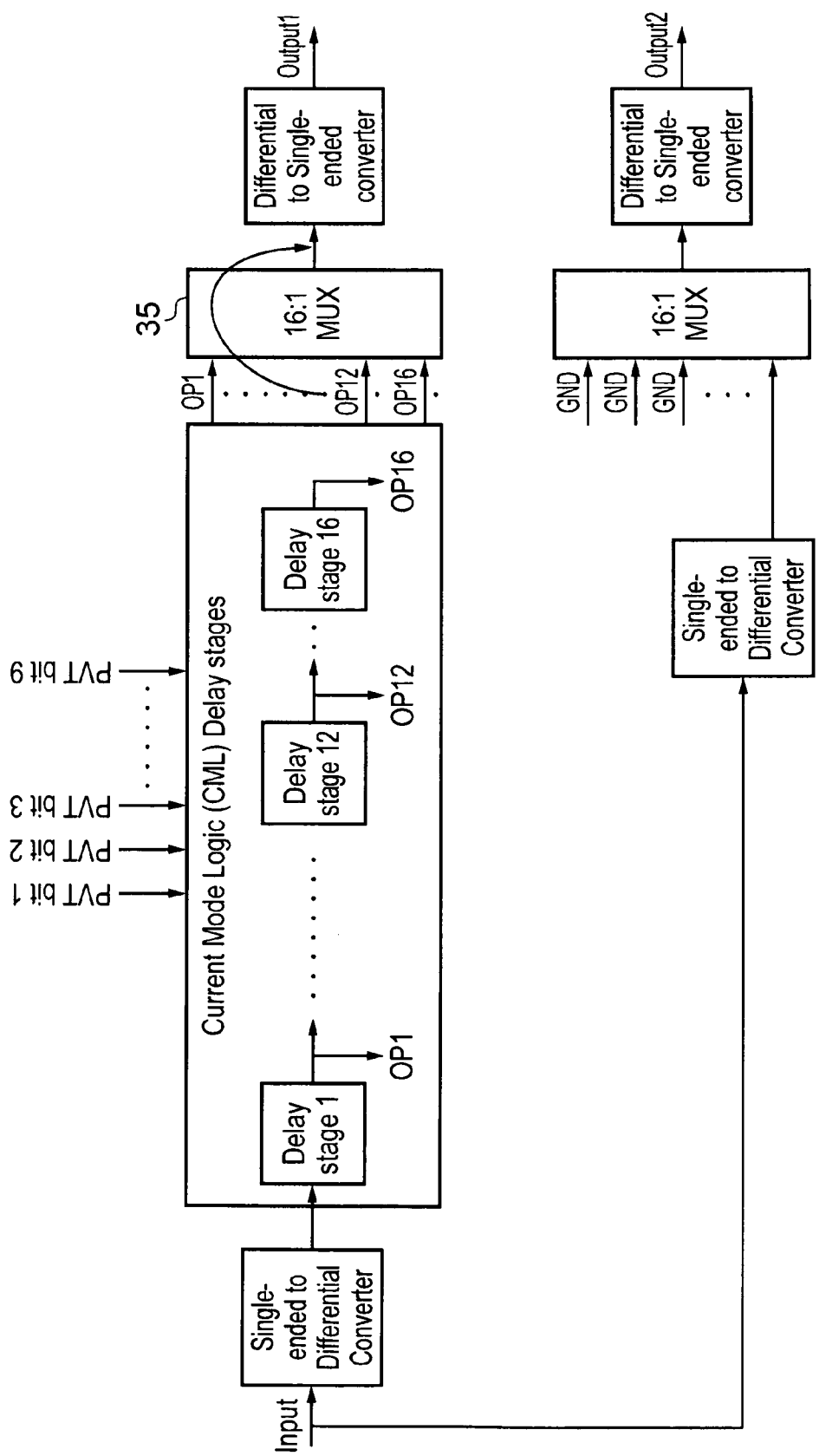
FIG. 7 shows the circuit of FIG. 4 during the analogue comparisons.
Figure 7:
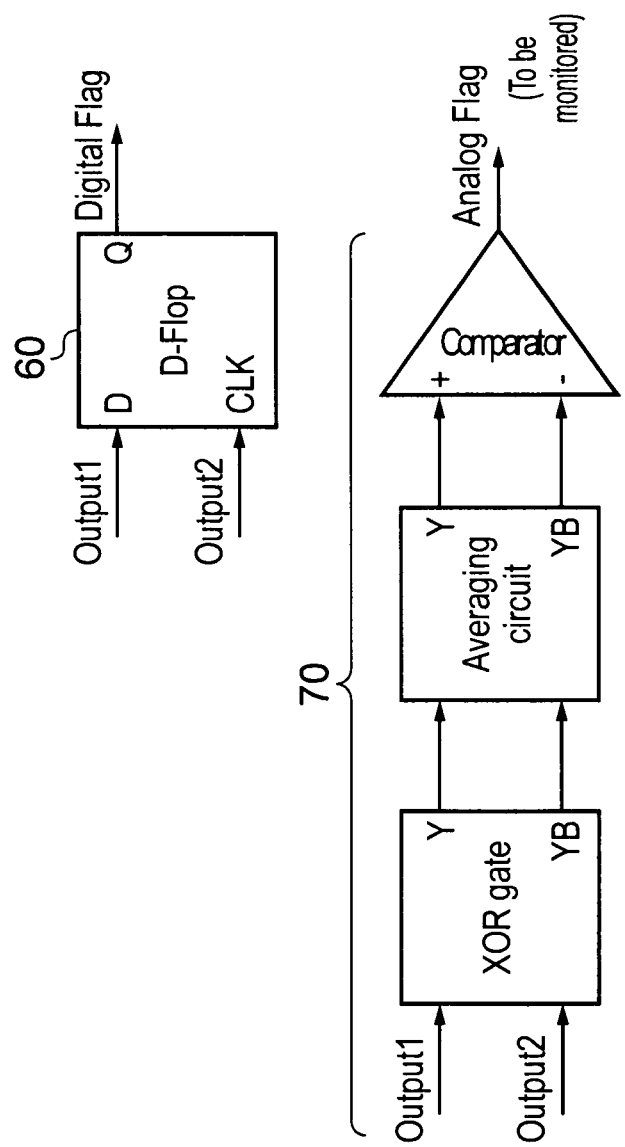

FIG. 7 shows the circuitry of FIG. 3 during the analogue comparison. At this time multiplexer 35 selects the output from the twelfth stage which is three quarters of the way along and is a stage where there should be a 270° phase shift if the output has a 360° phase shift.

This output is input to the analogue comparator 70 where the signal from three quarters of the way along the delay chain and the signal from the bypass path are compared. During analogue calibration, the finite state machine takes the PVT code that was obtained at the end of the digital calibration and increments it or decrements it until the analogue flag flips its output. As we are taking the output at the 270° phase change point that is ¾ of the way along the delay chain, and we are incrementing the PVT values in this case and increasing the delay we are looking for the comparator to flip its output from a 0 to a 1, this is shown in FIG. 8.

Figure 8:
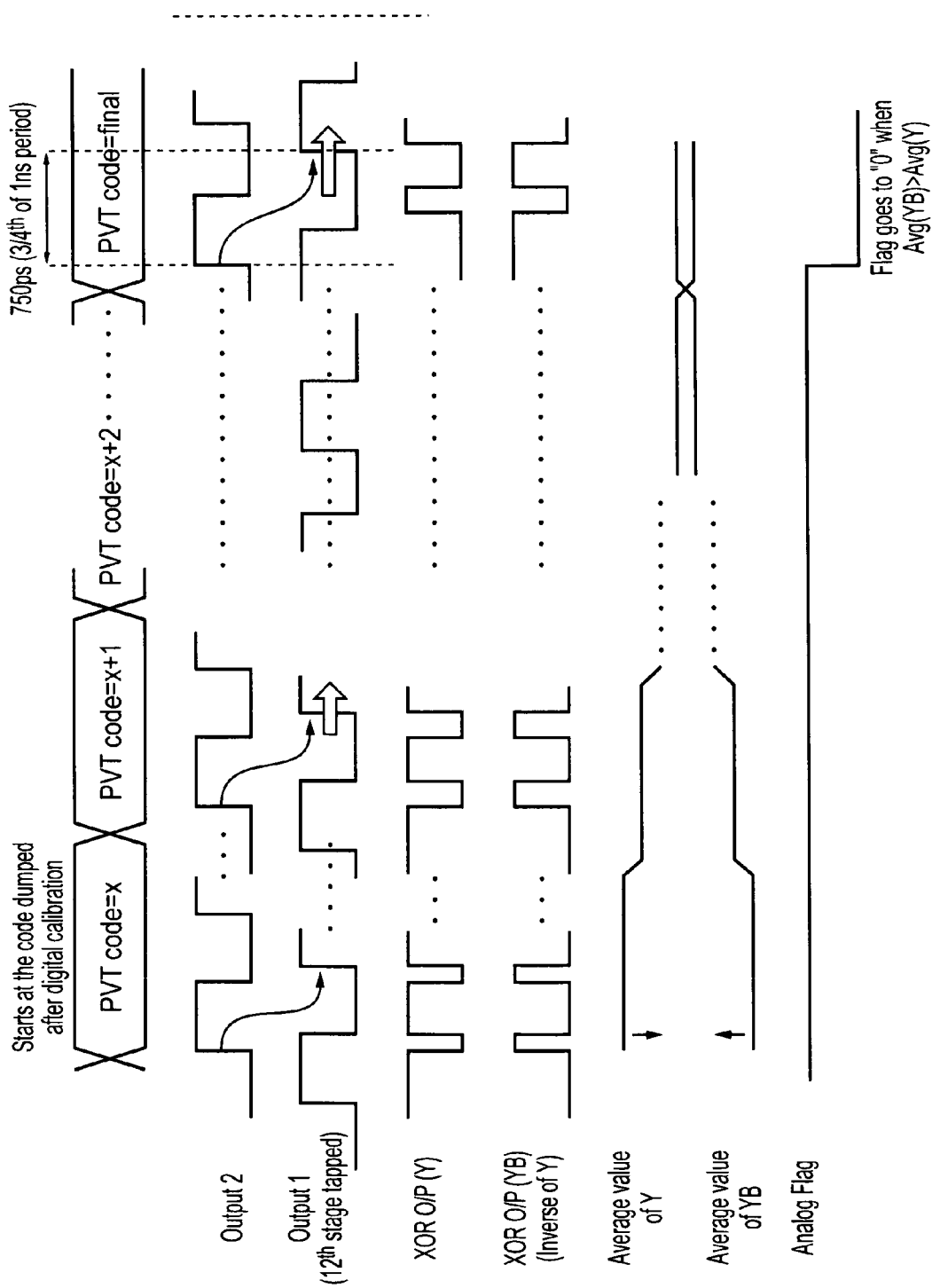
FIG. 8 shows waveforms of the circuit during analogue calibration.

FIG. 8 shows timing diagrams of the signals of FIG. 7. The averaging circuitry within analogue comparator 70 averages the amount of time that the signals are different for output Y and the amount of time that they are the same for output YB. Therefore initially as the signals are out of phase in this example the average value of Y is far greater than the average of YB. As the delay changes they are gradually brought together until the crossing point which is the point that is the final calibration point.

It should be noted that if one has some idea of whether the error in the digital comparison may have caused the flag to be set too soon or too late, then the input value from the digital calibration can be used and the PVT values adjusted in the desired direction. Alternatively, a PVT value that is close to the value detected during digital calibration but is slightly larger or smaller can be used as the starting point in order to know in which direction the values should be changed.

It should be noted that when comparing the average value of Y and the average value of the inverted Y, YB as in the diagrams shown FIG. 8 and FIG. 1*b* there is a difference in the comparisons. This is because in both cases one is increasing the delay values and thus, in the 90° phase change of FIG. 1*b*, the two signals are the same for most of the time moving to being different for most of the time as one goes beyond 90°. If one starts at 270° and then goes beyond it they are different most of the time moving to being the same most of the time. However, if one were to perform the comparison going from beyond to 270° and decreasing the delay then one would move from being the same most of the time to being different most of the time.

Figure 9:
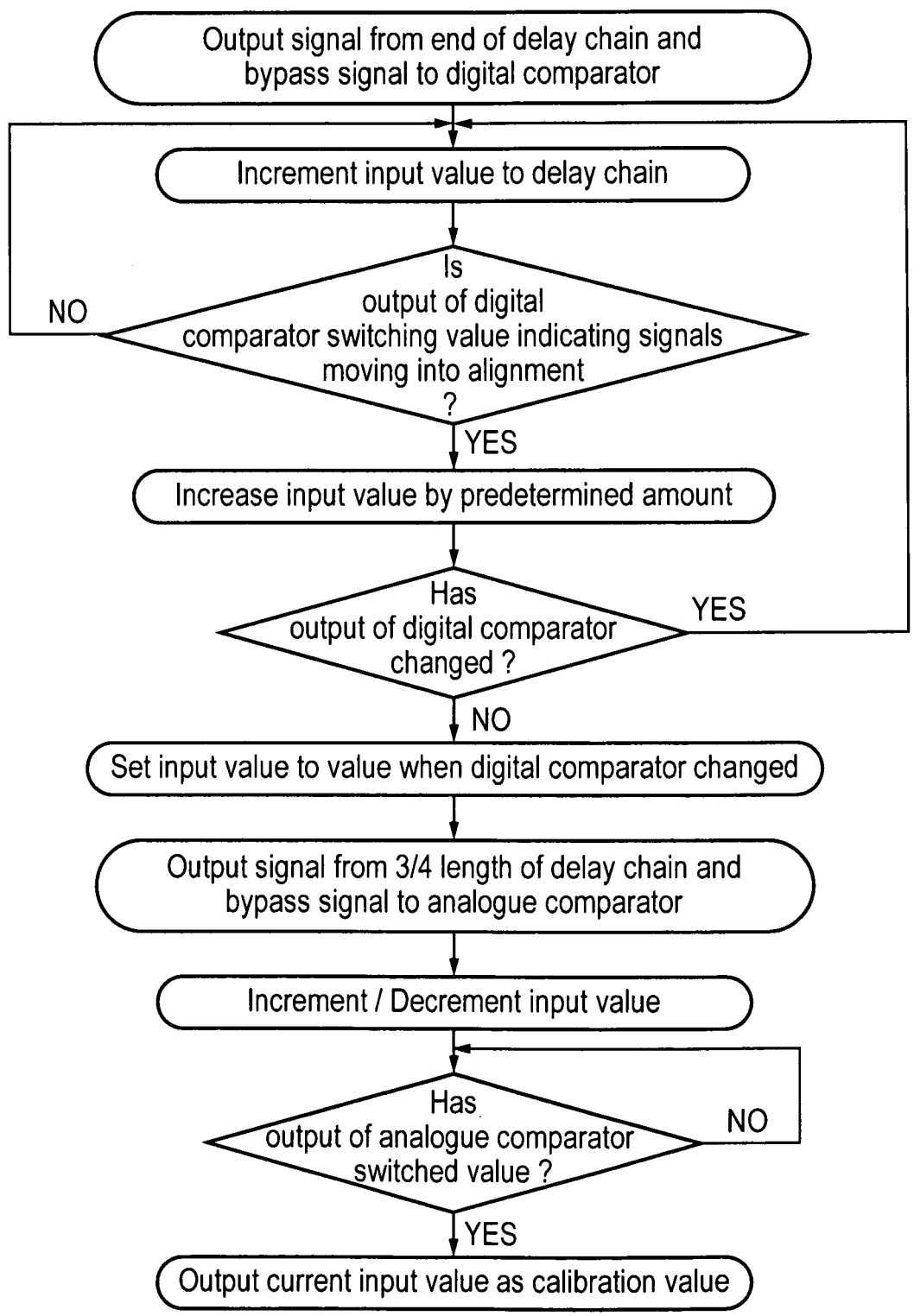
FIG. 9 shows a flow diagram illustrating steps in the method according to an embodiment of the present technique.

FIG. 9 shows a flow diagram illustrating steps in a method according to an embodiment of the present invention. In a first step output signals from an end of the delay chain and the bypass signal are input to the digital comparator. The input value to the delay chain is then incremented and it is determined whether or not the output of the digital comparator has changed. If it has not then the input value to the delay chain is incremented again and the steps are repeated until the output of the digital comparator does change.

At this point the input value is increased by a predetermined amount and the output of the digital comparator is checked to see if it changes again. If it does then the input value to the delay change is incremented from this new value and the steps of determining when the output digital comparator switches value are performed again. This is because if the output of the digital comparator changes again in response to the increase by this predetermined amount then the original change was not due to the signals becoming aligned but was due to jitter on one of the signals.

Once a steady change in the digital comparator has been determined then the input value is set to the value that it had when the digital comparator changed. It should be noted that in some cases it may be set to a value that is slightly more or slightly less than the value when the digital comparator changed and this may be selected according to the system and to the digital comparator. Digital comparators may not switch at exactly the time that the signals are aligned but may have some skew so that they switch early or late. If this is known the input value that is then put into the analogue system can be adjusted accordingly to decrease the number of steps required for alignment in the analogue comparison and to know whether to decrement or increment the input value.

The output signal from three quarters of the length of the delay chain is then input to the analogue comparator along with the bypass signal and depending on the circumstances is either incremented or decremented until the output of the analogue comparator has changed value. Whether the value is incremented or decremented may depend on the initial input value determined from the digital comparator. As noted previously the digital comparator switches as about the time that the signals are 360° out of phase and are therefore aligned again. However, it may have some skew and thus, it may switch at some distance from this point, if it is known which side of the point it will be it can be determined whether to increment or decrement.

Once the analogue comparator switches value then this indicates that the two signals are out of phase by 270° three quarters of the way along the delay chain and therefore this is an indication that one has reached the calibration point. The analogue comparison is far more accurate than the digital comparison but each analogue comparison takes time to settle such that the rate of increase or decrease of the input value needs to be made more slowly. For this reason, an initial point close to the switching point is found with the digital comparator and the analogue comparator is used to produce an accurate result. The result determined by the analogue comparison is output as the calibrated value.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the appended claims. For example, various combinations of the features of the following dependent claims could be made with the features of the independent claims.

We claim:

1. A calibratable delay chain comprising:
   a delay chain comprising a plurality of delay stages and adjustment circuitry configured to vary a delay of each of said plurality of delay stages in response to an input value; and
   calibration circuitry configured to calibrate a delay of said delay chain, wherein said calibration circuitry comprises:
   calibration control circuitry for controlling said calibration and supplying said input value to said adjustment circuitry;
   output selection circuitry configured to select an output from a predetermined point along said delay chain;
   a bypass path for bypassing said delay chain;
   a digital comparator configured to compare an output from said delay chain and an output from said bypass path;
   an analogue comparator configured to compare an output from said delay chain and an output from said bypass path; wherein
   said calibration control circuitry is configured to control said output selection circuitry to output a signal from one point on said delay chain to said digital comparator and to change said input value to said adjustment circuitry in a first direction at a first rate until a change in an output value of said digital comparator value is detected;
   said calibration control circuitry is configured to respond to said detected change in output value of said digital comparator to control said output selection circuitry to output a signal from a further point on said delay chain to said analogue comparator and to change said input value in a second direction at a second rate starting from a value determined by said input value at which said digital comparator's output value changed value, said second rate being slower than said first rate, a change in value output from said analogue comparator indicating an input value that provides a calibrated delay.

2. A calibratable delay chain according to claim 1, wherein said analogue comparator comprises circuitry for providing a signal indicating when said two outputs have a same value and a signal indicating when said two outputs have different values and averaging circuitry configured to average said two signals over time, said analogue comparator comparing said two averaged signals and detecting a point at which a larger of said two averaged signals becomes a smaller of said two averaged signal, such that said analogue comparator circuitry is configured to detect a quarter phase difference between said output signals.

3. A calibratable delay chain according to claim 2, wherein said analogue comparator comprises:
   exclusive OR circuitry for exclusive ORing said two outputs together and an inverter for generating an inverted value of said exclusive OR output;
   averaging circuitry for generating an averaged value of said exclusive OR output and an averaged value of said inverted value of said exclusive OR output; and
   a comparator for comparing said two averaged values and indicating when one of said two averaged values that was smaller than another becomes larger.

4. A calibratable delay chain according to claim 1, wherein said digital comparator is configured to determine when an output of said delay chain has a different value to an output of said bypass path, such that a change in output value of said digital comparator indicates a phase difference of 360° or a whole clock cycle between said two outputs.

5. A calibratable delay chain according to claim 1, wherein said output selection circuitry is configured to output a signal from an end of said delay chain to said digital comparator and from a point three quarters of the way along said delay chain to said analogue comparator, said digital comparator changing value in response to said output signal being delayed by a whole clock cycle, and said analogue comparator changing value in response to said output signal being delayed by three quarters of a clock cycle, such that said calibrated delay for said delay chain is a whole clock cycle delay.

6. A calibratable delay chain according to claim 1, wherein said digital comparator is a flip flop.

7. A calibratable delay chain according to claim 6, wherein said digital comparator is a D flip flop and calibration control circuitry is configured to detect said output of said D flip flop changing from a one to zero indicating that said two signals are moving into alignment.

8. A calibratable delay chain according to claim 1, wherein said first direction and said second direction are the same direction.

9. A calibratable delay chain according to claim 1, wherein said calibration control circuitry is configured to perform a verification step prior to controlling said output selection circuitry to output a value to said analogue comparator, said verification step verifying that said change in output value of said digital comparator is due to a difference in output signals and not to jitter on one of said output signals said verification step comprising:
varying said input value further in said first direction by a predetermined amount and determining whether said digital comparator continues to output said changed output value, if said digital comparator continues to output said changed output value said calibration control circuitry determines that said detected change in output values is due to a difference in output signals and proceeds to control said output selection circuitry to output a value to said analogue comparator.

10. A calibratable delay chain according to claim 9, wherein said calibration control circuitry is configured in response to said digital comparator not continuing to output said changed output value during said verification step to continue to increase said input value in said first direction until a further change in output value is detected and to perform said verification step for said further change in output value.

11. A calibratable delay chain according to claim 9, wherein said predetermined amount that said input value is increased by in said verification step is selected to change a delay in said delay chain by a time amount that is longer than a predicted jitter pulse.

12. A calibratable delay chain according to claim 1, wherein said output selection circuitry comprises a multiplexer and said adjustment circuitry comprises binary weighted capacative load circuitry within each delay stage.

13. A calibratable delay chain according to claim 1, comprising 4n delay stages where n is an integer, and wherein said digital comparator compares an output from said delay chain after 4n delay stages that is at an end of said delay chain and said analogue comparator compares an output from said delay chain after 3n delay stages.

14. A calibratable delay chain according to claim 1, wherein said calibration control signal is configured to change said input value in steps and to hold said input value at each value for at least ten times longer during said analogue comparison than during said digital comparison.

15. A delay locked loop comprising a calibratable delay chain according to claim 1.

16. A method of calibrating a delay chain, said delay chain comprising a plurality of stages and adjustment circuitry configured to vary a delay of each of said plurality of delay stages in response to an input value; said method comprising the steps of:
outputting a signal from one point on said delay chain to a digital comparator;
outputting a signal from a bypass path not passing through said delay chain to said digital comparator;
varying an input value to said adjustment circuitry in a first direction at a first rate until a change in an output value of said digital comparator value is detected;
outputting a signal from a further point on said delay chain to an analogue comparator;
outputting a signal from said bypass path to said analogue comparator;
varying said input value in a second direction at a second rate starting from a value determined by said value at which said digital comparator's output value changed value, said second rate being slower than said first rate until a change in value output from said analogue comparator is detected;
using said input value that generated said change in value output as a calibration value for said delay chain.

17. A method according to claim 16, comprising the further steps of:
prior to said step of outputting said value from a further point on said delay chain to said analogue comparator performing a verifying step of:
varying said input value to said adjustment circuitry further in said first direction by a predetermined amount and determining whether said digital comparator continues to output said changed output value; whereupon
if said digital comparator continues to output said changed output value performing said step of outputting said value from a further point on said delay chain to said analogue comparator; and
if said digital comparator does not continue to output said changed value performing said step of varying an input value to said adjustment circuitry in a first direction at a first rate until a change in said output value of said digital comparator value is detected again.

18. A method according to claim 17, wherein following said digital comparator detecting a change in said output value again performing said verifying step again.

19. A method according to claim 17, wherein said predetermined amount that said input value is increased by in said verifying step is selected to change a delay in said delay chain by a time amount that is longer than a predicted jitter pulse.

20. A calibratable delay chain comprising:
a delay chain comprising a plurality of delay means and adjustment means for varying a delay of each of said plurality of delay means in response to an input value; and
calibration means for calibrating a delay of said delay chain, wherein said calibration means comprises:
calibration control means for controlling said calibration and supplying said input value to said adjustment circuitry;
output selection means for selecting an output from a predetermined point along said delay chain;
bypass means for bypassing said delay chain;
digital comparing means for comparing an output from said delay chain and an output of said bypass means;
analogue comparing means for comparing two output signals, an output signal from said delay chain and an output signal from said bypass means; wherein
said calibration control means is for controlling said output selection means to output a signal from one point on said delay chain to said digital comparing means and for changing said input value to said adjustment means at a first rate until a change in an output value of said digital comparing means is detected;
said calibration control means is for responding to said detected output of said digital comparing means to control said output selection means to output a signal from a further point on said delay chain to said analogue comparing means and to change said input value at a second rate starting from a value determined by said input value at which said digital comparing means output value changed value, said second rate being slower than said first rate, a change in value output from said analogue comparing means indicating an input value that provides a calibrated delay.

* * * * *